United States Patent [19]
Clarke et al.

[11] Patent Number: 4,963,819
[45] Date of Patent: Oct. 16, 1990

[54] HIGH VOLTAGE APPARATUS

[75] Inventors: Graham J. Clarke, Ashbury; Gordon E. Hibbert, Swindon, both of Great Britain; Helge Jensen, Zorneding, Fed. Rep. of Germany; Robin J. T. Clabburn, Sevenhampton, Great Britain

[73] Assignee: Raychem Limited, London, England

[21] Appl. No.: 251,050

[22] Filed: Sep. 26, 1988

Related U.S. Application Data

[63] Continuation of Ser. No. 751,768, Jul. 2, 1985, abandoned.

[30] Foreign Application Priority Data

Jul. 2, 1984 [GB] United Kingdom ................ 8416791
Jul. 2, 1984 [GB] United Kingdom ................ 8416792

[51] Int. Cl.$^5$ .................... G01R 15/06; H02G 15/08
[52] U.S. Cl. .................... 324/126; 174/73.1
[58] Field of Search .............. 324/126; 340/870.37; 174/11 BH, 73 SC, 73 R, 142, 143, 73.1; 361/272, 302, 283, 284

[56] References Cited

U.S. PATENT DOCUMENTS

| | | | |
|---|---|---|---|
| 1,868,962 | 7/1932 | Atkinson | 174/73 R |
| 2,358,553 | 9/1944 | Beldi | 174/142 |
| 2,789,154 | 4/1957 | Peterson | 174/73 SC |
| 3,396,339 | 8/1968 | Miram | 324/126 |
| 3,826,860 | 7/1974 | DeSio et al. | 174/73.1 |
| 3,932,810 | 1/1976 | Kohler et al. | |
| 4,052,668 | 10/1977 | Schmitt et al. | 324/126 |
| 4,074,193 | 2/1978 | Kohler | |

FOREIGN PATENT DOCUMENTS

| | | |
|---|---|---|
| 824479 | 6/1982 | South Africa . |
| 346926 | 4/1931 | United Kingdom . |
| 832520 | 4/1960 | United Kingdom . |
| 1453679 | 10/1976 | United Kingdom . |
| 1460337 | 1/1977 | United Kingdom . |
| 1471570 | 4/1977 | United Kingdom . |

Primary Examiner—Ernest F. Karlsen
Attorney, Agent, or Firm—Edith A. Rice; Herbert C. Burkard

[57] ABSTRACT

The invention provides a high voltage capacitor suitable for measuring the voltage of an overhead power line. The capacitor dielectric is mounted directly on to the power line conductor, which serves as one electrode of the capacitor. The other electrode of the capacitor is mounted on to the outer surface of the dielectric, and is protected at each side by a guard ring. Stress control is provided between the outer capacitor electrode and the guard rings and also at the outer edges of the guard rings. The capacitor may be enclosed in an earthed housing, which can contain one or more current transformers. The apparatus can be used for fault detection and location, and may be used in combination with a power cable or a switch.

12 Claims, 6 Drawing Sheets

HIGH VOLTAGE APPARATUS

This application is a continuation of application Ser. No. 751,768, filed July 2, 1985, now abandoned.

This invention relates to high voltage apparatus, and particularly to a capacitor for voltage measurement. The capacitor is particularly though not exclusively for use with an overhead power line system, whereby the capacitor may form part of a voltage dividing circuit for measuring the line voltage.

British Patent Specification No. 1471570 discloses a high voltage monitoring arrangement in which a resin body is cast on to a conductor, and a conductive tubular element is embedded in the resin around the conductor. The conductor and the tubular element form the electrodes of a high voltage capacitor. The high voltage capacitor is connected to earth through a low voltage capacitor, thus forming a capacitive voltage divider so that the voltage of the conductor may be determined. An earthed guard ring electrode is also embedded in the resin beyond each end of the tubular element. The creepage path length along the exposed outer surface of the resin is increased by the provision of circumferential ribs, but the capacitance, and thus voltage, measurement would be uncontrollably affected by the flow of any leakage current along the outer surface. The electric potential gradient associated with such current flow would give rise to a capacitive coupling with the tubular element, thus detracting from accurate measurement of the voltage of the conductor. British Patent Specification No. 1453679 has a capacitor electrode and guard ring electrodes similarly embedded in cast resin, which is attached to an outer metal casing of switchgear. However, the inner surface of the resin is spaced from the high voltage conductor by an air space, and thus is subject to the flow of leakage current therealong, with the associated deleterious effect on the accuracy of the voltage measurement.

It is an object of the present invention to provide high voltage measuring apparatus that is compact, easy to assemble and of improved accuracy. It is another object of the invention to provide apparatus that is suitable, when appropriately modified in a convenient manner if necessary, for operation not only indoors in a sheltered environment, but also outdoors and in adverse environmental conditions. It is a still further object of the invention to provide apparatus that is conveniently modified to operate in combination with other electrical equipment.

In accordance with one aspect of the present invention, there is provided high voltage apparatus comprising a capacitor of generally cylindrical configuration, the capacitor comprising: an elongate, inner electrode; solid electrical insulation material mounted on the inner electrode to provide the dielectric of the capacitor; an outer cylindrical electrode substantially coaxial with the inner electrode and mounted on a portion only of the outer surface of the insulation material, the inner and outer electrodes and the insulation material being arranged to provide the generally cylindrical capacitor with a known capacitance; at least one substantially cylindrical guard ring electrode mounted on the outer surface of the insulation material spaced apart from an end of the outer electrode; and stress control means between the outer electrode and the or each of said guard ring electrodes, thereby to control the electrical stress between said electrodes.

The provision of solid insulation between the two electrodes of the capacitor, together with the electrical protection provided by the guard ring electrode(s), ensures that the capacitance measured is substantially unaffected by conditions externally of the capacitor, and thus that the consequent determination of the voltage of the inner electrode can be made with enhanced accuracy. Furthermore, by mounting the guard ring electrode(s) on the outer surface of the insulation material that forms the dielectric of the capacitor, any leakage currents that flow along the outer surface are arranged to flow to those electrodes, which are maintained at or near earth potential, thus preventing them influencing the capacitance measurement. In this way, it is thus seen that the guard ring electrode(s) fulfill another function in addition to ensuring that any variation of capacitance at the end(s) of the capacitor electrodes is prevented from affecting the capacitance measurement.

It will be appreciated that adverse environmental conditions may affect only part of the capacitor when for example, it forms part of a bushing of electrical equipment or a feedthrough for a wall of a building or other enclosure, such that part of the capacitor is otherwise environmentally protected. In such applications, only one guard ring electrode may be necessary, with stress control means applied to the gap between the guard ring electrode and the outer electrode. In other applications, such as when the capacitor is mounted on an overhead line, the guard ring and stress control functions will need to be applied at each end of the capacitor, that is to say on each side of the outer electrode. In any event, a guard ring and associated stress control, will be required in those operating conditions, and at one or each end of the capacitor, where surface leakage currents and currents flowing due to the presence of the stress control material, are such as to influence the capacitance to be measured between the inner and outer electrodes. Such "stray" currents have to be dissociated from the measuring circuit to which, in use, the outer capacitor electrode will be connected, and conveniently such currents are conducted to earth.

The provision of stress control means between the outer electrode and the guard ring electrode(s), which becomes increasingly important as the voltage increases into the high voltage range (that is to say above about 1 kV, and particularly above about 5 kV), further enhances the measurement accuracy, by eliminating, or at least substantially reducing, any discharge activity at the edges of the electrodes.

Preferably, further stress control is applied to the electrodes of the capacitor, to avoid or at least alleviate electrical discharges at the extremities thereof. Thus, for the electrodes on the outer surface of the dielectric of the capacitor, stress control means is preferably applied not only across any gaps therebetween, but also at the longitudinally outermost electrode edges. For example, where one further electrode is mounted on the dielectric on each side of the outer electrode, the further stress control means will extend from the outer end of each further electrode on to the dielectric.

The stress control means may take any suitable form. Preferably, this comprises material, for example resistive material, having a specific impedance of between about $10^6$ ohm-cm and $10^{10}$ ohm-cm, or high permittivity material, or material having a non-linear a.c. electrical impedance characteristic. The stress control means, however, may also be provided by electrically insulating material that is so shaped, for example into a stress cone, as to alleviate electrical stress at the electrode edges. Alternatively, the stress control means may take the form of shaping the edges of the electrodes, for example so as to have facing edges of adjacent electrodes smoothly curved rather than rectilinear, thereby avoiding the build-up of electrical stress at a sharp edge.

Where the conductor whose voltage is to be measured is an overhead conductor line, the capacitor may be disposed co-axially with the conductor. In this case, the inner electrode may comprise the conductor, for example by being spliced thereinto, thus carrying the full line current, or it may comprise a conductive tubular member that receives the line conductor therethrough and is in electrical connection therewith, so as substantially to be at the same potential as the conductor. Alternatively, the capacitor may be connected to the overhead line as a spur connection such that its inner electrode comprises the spur, or is mounted co-axially as a tubular member around the spur conductor. Electrical connection between the capacitor inner electrode and the conductor may, for example, be made by means of a conductive hung between the tubular member and the line conductor.

Advantageously, the inner electrode comprises a conformable layer of conductive material between the high voltage conductor or the tubular member and the insulation material of the high voltage capacitor, to minimise the occurrence of voids therebetween.

Further electrical protection of the capacitor, particularly for use out of doors, or in other adverse environments, may be provided by an outer surface of electrically insulating and substantially non-tracking material, which may have a shedded and/or convoluted configuration along at least a part of its length. Such material preferably extends over at least part of the stress control surfaces, and on to the dielectric. Unless the dielectric itself is substantially non-tracking, the material may extend over the whole of the dielectric, and may advantageously overlap the end or ends thereof so as to form an environmental seal on to the exposed inner electrode of the capacitor. A convoluted surface may conveniently be achieved by applying a convoluted tubing. The sheds may be applied, for example heat-recovered, individually, or as a more complex moulding, on to cylindrical tubing.

Advantageously, at least the outer electrode of the capacitor is enclosed within a housing for environmental protection, preferably forming an environmental seal. The housing advantageously is of electrically conductive material, such as metal, and is connected to each guard ring electrode. The guard ring electrode(s) and the housing may be formed integrally.

Environmental sealing provided by the housing further protects the outer electrode from the influence of the weather, for example ensuring that it is not subject to rain or other pollution, which could give rise to earth leakage currents that could affect the capacitance of the capacitor in an erratic manner, thus rendering accurate measurement difficult if not impossible. Although the housing itself will still be subject to such environmental conditions, its electrical isolation from the outer electrode of the capacitor ensures that the capacitance of the capacitor is not affected. The housing is, in practice, maintained at a substantially fixed, preferably earth, potential. The housing may thus effectively provide a Faraday Cage for the components therewithin.

Advantageously, the capacitor of the present invention may be formed from tubular components, preferably being recoverable, for example heat-recoverable, or alternatively they may be formed of elastomeric material arranged as push-fit components.

A recoverable article is an article the dimensional configuration of which may be made to change appreciably when subjected to the appropriate treatment. The article may be heat-recoverable such that the dimensional configuration may be made to change when subjected to a heat treatment. Usually these articles recover, on heating, towards an original shape from which they have previously been deformed but the term "heat-recoverable", as used herein, also includes an article which, on heating, adopts a new configuration, even if it has not been previously deformed.

In their most common form, such articles comprise a heat-shrinkable sleeve made from a polymeric material exhibiting the property of elastic or plastic memory as described, for example, in U.S. Pat. No. 2,027,962; 3,086,242 and 3,597,372. As is made clear in, for example, U.S. Pat. No. 2,027,962, the original dimensionally heat-stable form may be a transient form in a continuous process in which, for example, an extruded tube is expanded, whilst hot, to a dimensionally heat-unstable form but, in other applications, a preformed dimensionally heat stable article is deformed to a dimensionally heat unstable form in a separate stage.

The polymeric material may be cross-linked at any stage in its production that will enhance the desired dimensional recoverability. One manner of producing a heat-recoverable article comprises shaping the polymeric material into the desired heat-stable form, subsequently cross-linking the polymeric material, heating the article to a temperature above the crystalline melting point or, for amorphous materials the softening point, as the case may be, of the polymer, deforming the article and cooling the article whilst in the deformed state so that the deformed state of the article is retained. In use, since the deformed state of the article is heat-unstable, application of heat will cause the article to assume its original heat-stable shape.

In other articles, as described, for example, in British Pat. No. 1,440,524, an elastomeric member such as an outer tubular member is held in a stretched state by a second member, such as an inner tubular member, which, upon heating weakens and thus allows the elastomeric member to recover.

When formed from recoverable material, such as polymeric or elastomeric components, which are preferably tubular, a preferred configuration is to recover on to a metal, for example aluminium or copper, tube that forms the inner, high-voltage, electrode, a first layer of conductive material, to provide a smooth surface and to minimise the formation of voids, one or more layers of insulating material, longitudinally spaced-apart layers of conductive material to form the outer electrode and the guard rings, one or more longitudinally spaced-apart semi-conductive layers to provide stress control, and one or more longitudinal, spaced-apart insulating and non-tracking layers to provide the protective surface, and then to mount the conductive housing, for example as a pair of aluminium half-shells, around the layers. It will be appreciated that in less adverse environmental conditions, some of these components may be dispensed with.

The conductive, insulating and semi-conductive heat-recoverable tubing preferably used in the capacitor of the apparatus of the present invention, may be that sold by Raychem under the Trade Names CNTM, BBIT and SCTM respectively. As an alternative, co-extruded Raychem tubing as sold under the Trade Names CCIM and CICM may be used, which respectively have a conductive inner and insulating outer component, and an insulating inner and conductive outer component. In the latter configuration, it will be appreciated that the total insulation thickness is formed from a portion of each of the two tubings.

In an alternative configuration, the insulation material (the dielectric) of the capacitor may be a refractory material, such as ceramic, and the inner and outer electrodes may be spray-coated thereon.

It is envisaged, however, that the capacitor may be constructed by more conventional techniques, for example by casting an insulating resin on to an inner electrode and then spraying metal on to the outside to form the required electrode arrangement. Alternatively, the capacitor may be formed from wound paper or polymeric film.

The capacitor of the apparatus of the invention may be used in a voltage divider circuit, in which case the outer (low-voltage) electrode is connected to earth through another, electrical circuit component, which may be another capacitor, of known impedance. At least the other known impedance component of the divider-circuit may be mounted inside the conductive housing of the high voltage capacitor, when such a housing is present. With such arrangements, the capacitor may be used in a very convenient manner to measure the voltage of the inner electrode, which may be connected to a high voltage elongate conductor.

It is also envisaged that the capacitor of the apparatus of the invention used for measuring voltage, may be associated with a current measuring arrangement and appropriate electric or electronic circuitry such that from the combined measurement of voltage and current at one location of a power distribution system, for example of an overhead line system, not only the existence but also the direction and distance away of a fault may be determined. To this end, the current measuring device may be a current transformer, and one, or more, such devices may advantageously be mounted within the protective housing, when provided, of the high voltage capacitor. Advantageously, the or each current transformer is mounted around the capacitor co-axially with the outer electrode. In this manner, the transformer is electrically shielded from the higher voltage of the inner electrode, thus allowing the use of, cheaper, low voltage current transformers.

Two or more current transformers may be employed in the apparatus of the invention, whereby, for example, a first current transformer is arranged to measure the current flowing through the inner electrode under normal operating conditions, a second current transformer is arranged to measure the current flowing through the inner electrode under fault conditions, and a third current transformer is arranged to take electrical power from the inner electrode and to supply this for the operation of electrical equipment. The electrical equipment may be the voltage divider, or other measuring, circuit of the capacitor of the apparatus, or it may be a battery for storing electrical charge for some other use.

When the apparatus of the invention comprises the capacitor, for the measurement of voltage of a three-phase overhead power line for example, and a current transformer for measurement of current flow through the line, the fault detecting capability may be enhanced by not only having one piece of the apparatus mounted on each phase conductor, but also by mounting a further current transformer so as to encompass all three phase conductors. The further current transformer will thus measure zero net current under normal operating conditions, and the net out-of-balance current under fault condition. The accuracy of fault current detection may thus be enhanced by the further current transformers on the phase conductors, which need to detect the fault current against flow of the full, normal current through the conductor.

The measurement of the voltage of, and current flowing through, a conductor allows the phase angle to be determined, which is useful in power factor correction.

The capacitor of the apparatus of the invention, when electrically coupled to a conductor, for example an overhead conductor of a power distribution system, may be used as part of a system to inject high-frequency communication signals on to the conductor for transmission therealong, when coupled to a suitable electrical circuit.

It is envisaged that insulators, such as tension, stand-off or suspension insulators, may incorporate the capacitor so as to provide within a single structure both the functions of insulating a high voltage overhead line from an earthed support tower, for example, and of line voltage measurement.

As a further example of the combination of the present apparatus with other electrical equipment, one end of the capacitor of the apparatus may be connected to an electric power cable, by being spliced thereto, so as to be electrically in series therewith. This interconnection is to be carried out such that the outer conductive screen of the cable forms an extension of a guard ring of the capacitor, so that the cable is arranged to complete the protection of the capacitor outer electrode on the cable side of the capacitor. The other end of the capacitor may be connected to a conductive lug, such that the cable may be connected to other electrical equipment, such as switchgear or a voltage transformer, through the apparatus of the invention. In an alternative embodiment, said other end of the apparatus may be provided with a socket for mounting on to a bushing of equipment such as switchgear or a voltage transformer. In the latter embodiment, it is envisaged that said other end of the apparatus could take the form of an adaptor, either in-line or L-shaped (elbow), that is conventionally used for connecting a power cable to equipment such as switchgear and transformers. Such an adaptor may be of the form disclosed and claimed in our co-pending British Patent Application No. 2,154,382 and European Patent Application No. 147,979.

It is also envisaged that the measurement function of the present apparatus may be combined with a switching function whereby for example the inner electrode of the capacitor forms part of the switch, or alternatively is electrically connected in series therewith. An output signal from the apparatus may be used directly to open or close the switch. In the absence of load current, capacitance change can be used to indicate the status of the switch. Thus, the capacitance of the apparatus will be different depending on whether the switch is open or closed and depending on whether one or the other or both contacts are energised. By determining in advance the capacitance of the apparatus in each of these states, measurement of the capacitance during operation of the apparatus is accordingly an indication of the state of the switch. The inner, high voltage, electrode of the capacitor may be formed by the contacts of the switch, and the outer, low voltage, electrode may be formed from a metal housing of the switch, or may be a separate conductive member within the switch housing, which may be mounted on an inner insulating member. If necessary, electrical connection through the switch housing may be made by means of a glass-to-metal seal. The switch may, for example, be as described and claimed in co-pending Euro-PCT Patent Application No. 148,851.

Accordingly, in accordance with another aspect of the present invention, there is provided an electrical switch comprising first and second contact elements movable relative to one another between two positions corresponding respectively to an open condition and a closed condition of the switch, an electrically conductive member spaced apart from said contact elements and capacitively coupled to both of said contact elements in each of said positions, and means for measuring the capacitance between said member and said contact elements.

Thus, by disposing a single electrode adjacent, for example as a cylinder co-axially around, the switch contacts, all the above-mentioned information is obtainable and requires only a single lead to be taken from the outer electrode to measuring apparatus, this being particularly convenient when the electrode is located within a housing of the switch.

The capacitance measuring circuit is preferably as described above.

The switch may have associated therewith one or more current transformers operating as described above, and preferably located within an earthed metal housing.

The invention also provides a method of determining the condition (open, closed, energised, de-energised) of a switch, wherein a contact assembly of a switch comprises a high voltage electrode of a capacitor, whose other electrode is provided by a conductive member disposed within the switch housing, or comprises the (conductive) housing itself, the two electrodes being capacitively coupled together in all the aforesaid conditions of the switch, the capacitance between said electrodes being measured, for example by a capacitive voltage divider circuit, so as to provide, in accordance with pre-determined capacitance measurements, an indication of the condition of the switch.

In accordance with a further aspect of the present invention, there is provided a method of forming high voltage apparatus comprising a capacitor of generally cylindrical configuration, wherein an inner electrode thereof comprises a bare (that is to say, uninsulated) elongate conductor, or an elongate tubular conductive member mounted around and in electrical contact with a bare elongate conductor, comprising the steps of mounting solid insulation material around the inner electrode to form the dielectric of the capacitor, mounting an outer cylindrical conductive member around an intermediate longitudinal portion only of the outer surface of the dielectric to form the outer electrode thereof, disposing a cylindrical guard ring electrode around the capacitor dielectric on the outer surface thereof adjacent an end of the outer electrode at a location spaced apart therefrom, and applying stress control means between the outer electrode and the guard ring electrode.

The method of the invention preferably also involves the provision of further components having features described above in accordance with the apparatus of said one aspect of the invention.

The apparatus of the invention may thus provide in assembled form a capacitor having a tubular inner electrode that serves as a support for the remaining components, requiring only its mounting on to an elongate conductor, and suitable electrical connection to the conductor and to a measuring circuit, such as a voltage divider, for determination, for example, of the voltage of the conductor. Alternatively, the capacitor may be formed in place on the elongate conductor.

Apparatus for the measurement of voltage, of current, and combinations thereof with electric power cables, and the methods of assembly of such apparatus, each in accordance with the present invention, will now be described, by way of example, with reference to the accompanying drawings, in which.

Figure 1:
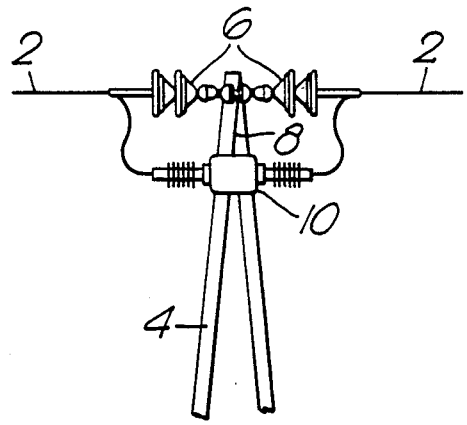
FIG. 1 shows the apparatus mounted on an overhead power distribution line.

Referring to FIG. 1, an overhead, bare conductor 2 of a 24 kV power distribution system is shown in the region of an earthed support tower 4. The conductor 2 is mounted on and insulated from the tower 4 by a pair of tension stand-off insulators 6, one on each side of the tower, with the conductor 2 itself passing in a loop around the tower. A support arm 8 extends from the tower 4 and locates the voltage and current measurement apparatus 10 around the looped conductor 2. The apparatus 10 is shown in more detail in FIG. 2.

The apparatus comprises a high voltage capacitor for measuring the voltage of the conductor 2, and three current transformers, two for measuring the current flowing through the conductor 2 under different conditions, and the third providing means for tapping power from the conductor.

Figure 2:
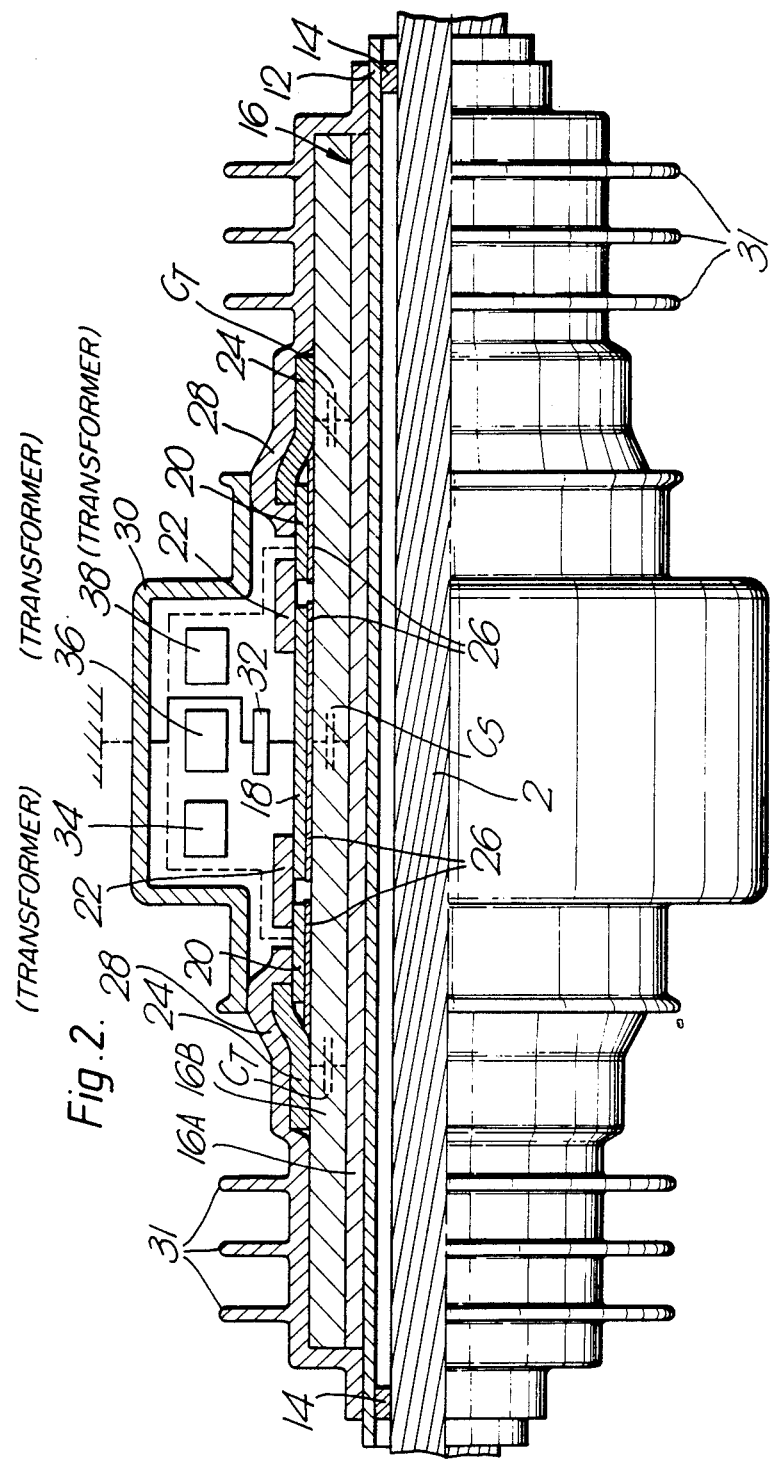
FIG. 2 is an elevation of the apparatus, partially in section.

Referring to FIG. 2, the inner electrode of the capacitor is formed primarily by a rigid hollow alluminium tube 12 of slightly larger internal diameter, say 38 mm, than the outer diameter of the stranded conductor 2. The tube 12 is 15 securely mounted at each end on the conductor 2 by conductive bungs 14, thus also assuring that the electrode tube 12 is at the same potential as the high voltage conductor 2. A co-extruded, heat-shrinkable, polymeric tubing 16, sold by Raychem under the Trade Name CCIM, having a conductive inner component 16A and an insulating outer component 16B, is shrunk on to the metal tube 12 so as to cover an intermediate portion only thereof, thus leaving each end of the tube 12 exposed. A conductive heat-shrinkable polymeric tubing 18, sold by Raychem under its Trade Name CNTM, is recovered over a central, graphite-coated portion only of the co-extruded tubing 16, and forms the outer, low voltage electrode of the capacitor. The insulating component 16B of the co-extruded tubing 16 forms the dielectric of the capacitor between the outer electrode 18 and the inner electrode, comprising the metal tube 12 and the inner component 16A of the co-extrusion 16, and provides a known capacitance. The conducting component 16A is conformable to the outer surface of the metal tube 12, thus filling any surface irregularities therein. Furthermore, since the conducting and insulating layers 16A and 16B respectively are co-extruded, the existence of voids therebetween, which could otherwise give rise to electrical discharges, is precluded.

A pair of heat-shrinkable conductive polymeric CNTM tubings 20 are recovered over the insulation tubing 16B at longitudinally spaced-apart, graphite-coated locations on respective sides of the outer electrode 18 to form guard rings therefor (as further described below). Stress control of the gaps between the guard rings 20 and the outer electrode 18, and of the longitudinal outer edges of the guard rings, to minimise the occurrence of electrical discharges is provided by recovering heat-shrinkable semi-conductive polymeric tubings 22 and 24, as sold by Raychem under the Trade Name SCTM, over these locations respectively. The electrical stress control at the edges of the guard rings 20 and the outer electrode 18 is enhanced by applying conductive paint 26 along the dielectric surface adjacent these edges before applying the electrodes and the tubings 24. To this end, a thin layer of graphite is sprayed on to the outer surface of the insulation 16B over three discrete regions, which subsequently receive the electrodes 18 and 20. The graphite layer beneath the electrodes alleviates the formation of voids, which could give rise to electrical discharges, at the interface between the insulating and conducting components.

The exposed surfaces of the stress control tubings 24 and the dielectric 16B, on each side of the outer electrode 18 are then enclosed within heat-shrinkable polymeric tubings 28 having electrically insulating and non-tracking properties, as sold by Raychem under the Trade Name HVTM. The tubings 28 overlap respective stress control tubings 24 completely, and extend at one end on to respective guard rings 20 and at the other end over the dielectric 16B and on to the inner electrode 12.

Environmental protection and electrical screening of the exposed outer electrode 18 and guard rings 20 is provided by clamping therearound two aluminium half-shells to form a housing 30 that seals at each end on to respective HVTM tubings 28. The capacitor support arm 8 is securely attached to the housing 30.

The capacitor construction is completed by the provision of two groups of a plurality of sheds 31, preferably of the same insulating and non-tracking HVTM material as the tubings 28. The sheds 31 may be heat shrunk on to the tubings 28, but advantageously they are formed integrally therewith, for example by moulding.

The apparatus 10 of FIG. 2 is particularly suited for outdoor use. However, if it is required to use the apparatus indoors, or in otherwise dry and non-polluted environments, then it may be possible to dispense with the outer insulating and non-tracking components 28, and also with the housing 30. However, even in such conditions it may still be preferable to provide an outer housing to extend at least over the electrode 18, and advantageously also over the guard rings 20 and the stress control tubings 24. Furthermore, it is envisaged that when the apparatus is mounted so as to extend between polluted and non-polluted environments, for example as a bushing to carry a conductor from an external polluted environment into the protected environment of electrical apparatus, then one end only of the apparatus, the external end, may have components such as 28 and 30, whilst the other end, the internal end, may be simplified as described above.

It will thus be appreciated, that in the absence of the outer components of insulating tubing 28, and housing 30, any leakage currents on the outer surface of the insulation 16B will flow to the earthed guard rings 20 and will thus not influence the outer electrode 18. The protection of the electrode 18 is enhanced by disposing the conductive housing 30 therearound, advantageously electrically connected to the guard rings 20. With the presence of the outer insulation cover 28, any leakage currents that flow therealong are still harmlessly diverted to earth through the guard rings and/or the housing 30.

A measuring capacitor 32 of capacitance $C_M$ is schematically shown located within the housing 30. The electrical connections from the capacitor 32 to the outer electrode 18, the guard rings 20 and the housing 30 are also shown schematically, as are the earthing of the housing 30, the capacitance $C_S$ of the known fixed capacitor between the inner and outer electrodes 12 and 18, the capacitance $C_T$ of the variable capacitance capacitor at each side thereof. In addition there exists a surface leakage resistance ($R_L$) along the surface of the HVTM tubings 28 between the high voltage inner electrode 12 and the earthed housing 30.

The capacitance $C_T$ arises from the capacitive effects of, and interaction between, the stress control material 24, the insulation material 16B and 28, and the electrodes 12 and 16A.

It will be appreciated that four stress control tubings are employed, whereas their functions may be carried out by a fewer number of tubes, for example by a single tube extending completely from the dielectric 16B on one side, across both guard rings 20 and outer electrode 18 and on to the dielectric 16B on the other side, provided that the necessary electrical contacts from the guard rings and outer electrode can be made satisfactorily. Similarly, the insulating and non-tracking tubings 28 may be formed integrally.

The apparatus 10 is also provided with three current transformers, shown diagrammatically at 34,36 and 38, which are wound circumferentially around and co-axial with the conductor 2. Current transformer 34 is arranged to measure the current flowing along the conductor 2 under normal operating conditions, and will saturate when a fault current passes. Current transformer 36 is arranged to measure the value of any fault current flowing along the conductor 2. Current transformer 38 is arranged to tap power from the conductor 2, for the supply and operation of other electrical equipment (not shown). It will be appreciated that suitable electrical circuitry (not shown) will be associated with the transformers 34,36 and 38 to achieve the stated objects.

As can be seen from FIG. 2, the transformers 34, 36 and 38 are not only mounted within the earthed housing 30, but are also screened from the high voltage conductor 2 by the low voltage capacitor electrode 18, which is arranged to be at a potential of the order of 10 volts. Thus, current transformers able to withstand and operate at high voltages are not necessary, low voltage current transformers being quite adequate, and comparatively cheaper.

In particular, and in general, it is envisaged that the current transformers of the apparatus of the invention will be used to measure or monitor the current flowing through the associated conductor, or to tap power from the conductor so as, for example to supply power to the electronic equipment associated with the capacitor for the determination of the conductor voltage, or to operate equipment, such as a switch, responsive to the voltage and/or current that may be measured by the apparatus.

Figure 3:
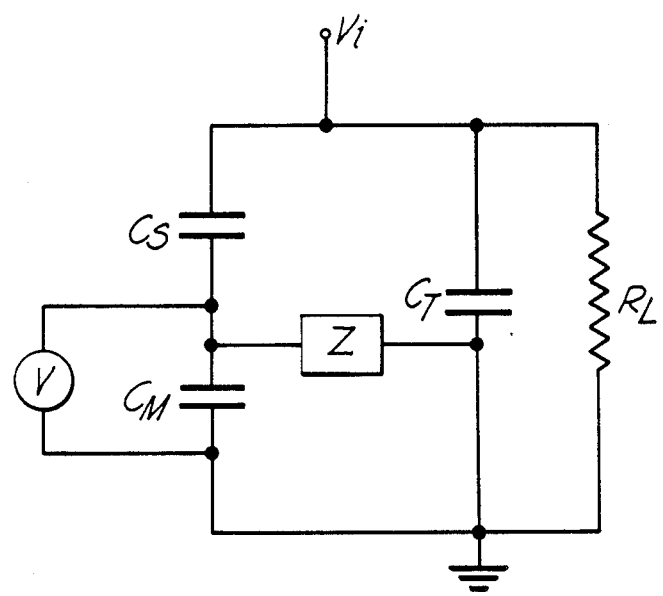
FIG. 3 is the equivalent electrical circuit of the capacitor of the apparatus when connected into a suitable voltage measuring circuit.

FIG. 3 shows the equivalent electric circuit of the capacitor arrangement of the apparatus of FIG. 2, operating as a capacitative voltage divider circuit for determining the voltage Vi of the inner, high voltage electrode 12, and thus of the overhead conductor 2. Z represents the impedance of the gaps between the guard rings 20 and the outer electrode 18, and as such eliminates from the voltage measured at V the effects of variation of the capacitance $C_T$ and resistance $R_L$. In this respect, it should be noted that the capacitance $C_T$ at the termination of the capacitor 10 is affected particularly by ambient temperature, and that $R_L$, the surface leakage resistance, is particularly affected by humidity and the amount of pollution in the environment. Furthermore, $C_T$ and $R_L$ interact with each other. Thus, by measuring the voltage V across the measuring capacitance $C_M$, the voltage Vi of the overhead conductor may be determined to a high degree of accuracy. It is considered that with the use of guard rings, the capacitor 10 can be arranged to give an overhead line voltage measurement accurate to within about 0.1% to 5%.

Typically, for use with a 24 kV power line, the capacitance $C_S$ is arranged to be about 150 pF, generally being within the range of 50 pF to 200 pF, and the potential of the outer, low voltage electrode 18 will be between about 10 V and 50 V.

Referring again to FIG. 1, it is envisaged that the apparatus 10 may be located in place of the insulators 6, so as to lead the conductor 2 directly and safely passed the earthed support tower 4.

Figure 4:
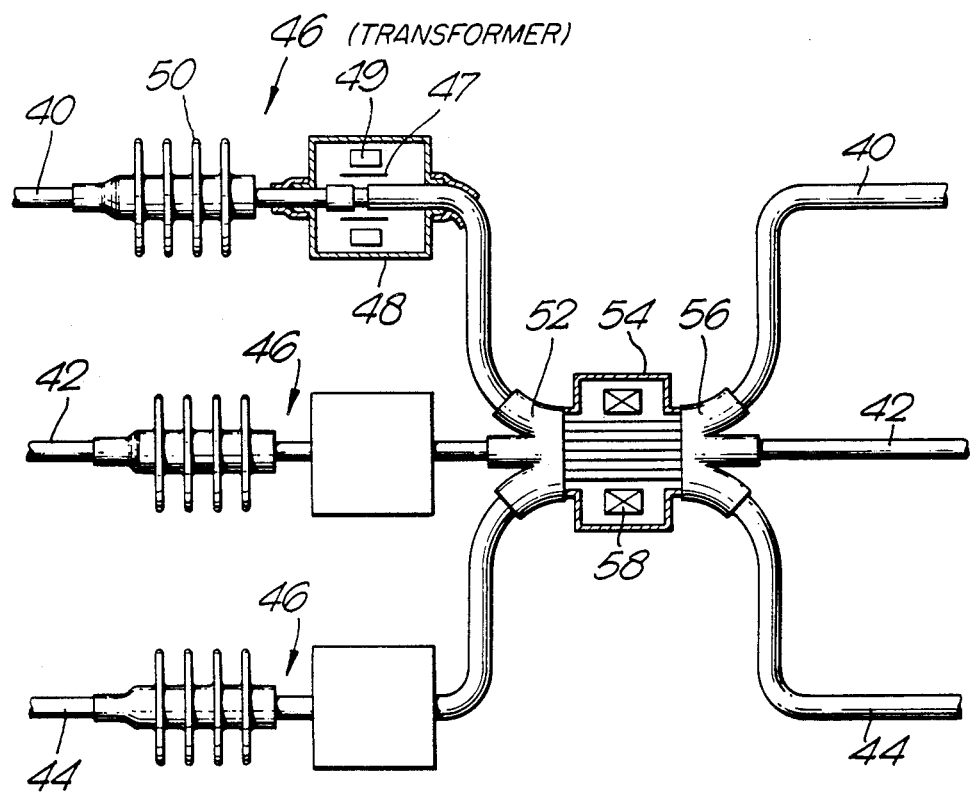
FIG. 4 shows diagrammatically the mounting of three pieces of a modified apparatus of FIG. 2 on respective phase conductors of a three-phase overhead power supply, and a current transformer common to all the phase conductors.

Referring to FIG. 4, a three phase overhead line of a medium voltage (24 kV to 36 kV) distribution network comprises bare conductors 40, 42, 44 of respective phases that usually are spaced apart by a distance to ensure that there is no contact or electrical interference therebetween in use (as indicated at each end of the Figure). A voltage and current measuring apparatus 46 is mounted on each conductor, the apparatus being essentially in accordance with that shown in FIG. 2. That is to say, the apparatus comprises an earthed metal housing 48 that encompasses a high voltage capacitor and a current transformer mounted coaxially therewith, shown schematically at 47 and 49 respectively, the capacitor having guard rings and stress control associated therewith, as described above. An insulating and non-tracking outer sleeve 50 of heat-recoverable polymeric material, and having a shedded outer configuration extends away from one side of the housings 48, on to the respective bare conductor. The conductors emerge from the other side of their respective housings 48 as metal screened bus bars, and the three bus bars are brought towards each other, pass into an insulating breakout 52, lie parallel and close to one another as they extend through an earthed metal housing 54, pass through another insulating breakout 56, and diverge before resuming their parallel but spaced apart course as bare conductors 40, 42 and 44. The housing 54 contains a current transformer 58 that encompasses all three of the bus bar conductors.

Each piece of apparatus 46 operates as described above with reference to FIG. 2, so as to measure the voltage of, and current flowing through, its respective conductor 40, 42 and 44. The current transformer 58 in the housing 54, however, will measure the net current flow through all three phases, being zero under normal operating conditions when each conductor carries the same current. If a fault occurs on the line leading to an out-of-balance current in the conductors, the value of that current will be measured by the transformer 58. That change in current flow will also be noted by the current transformers 49 in the apparatus 46, but as a much smaller percentage change, since the transformers 49 usually measure the full line current. Accordingly, a less sensitive transformer may be used for the transformer 58 than for the transformers 49.

Figure 5:
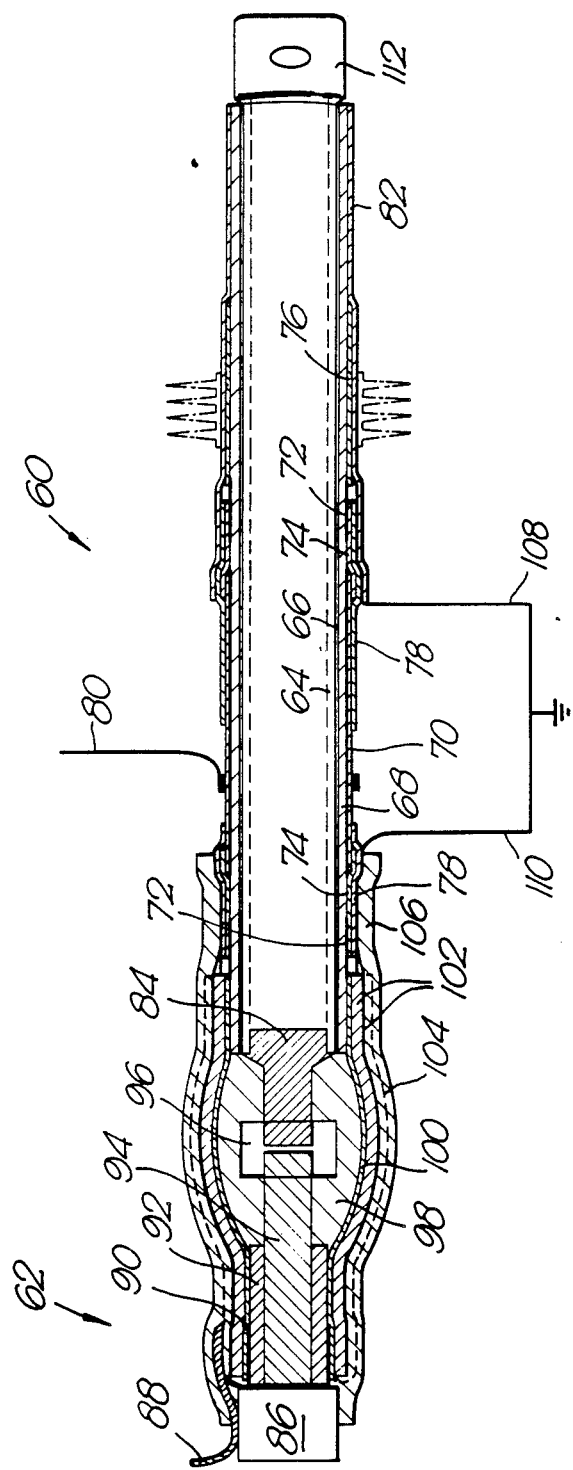
FIG. 5 shows a simplified form of the apparatus of FIG. 2 spliced to an electric power cable to form a lug termination therefor.

FIG. 5 shows a voltage measuring capacitor 60 having the essential features of the capacitor described with reference to FIG. 2. The capacitor 60 is spliced at one to a high voltage power cable 62.

The capacitor 60 has an inner aluminium tubular electrode 64 with a conductive smoothing layer 66 thereon. A polymeric insulating tube 68 is recovered on to the inner electrode 64 to form the dielectric of the capacitor. Conductive paint together with a recovered polymeric conducting tubing 70 is mounted on an intermediate portion of the outer surface of the insulation 64, to form the outer, low voltage, electrode of the capacitor 60. Guard ring electrodes 72 are coupled to the electrode 70 by stress control tubings 74, and the outer edge of the guard ring 72 furthest from the cable 62 is stress controlled on to the dielectric 68 by a further tubing 76. Further insulating tubings 78 extend over the stress control tubings 74 and on to the surface of the electrode 70 so as to leave only a small portion thereof exposed for attachment of a connecting lead 80. At the end of the capacitor 60 remote from the cable 62, the insulating tubing 78 and the stress control tubing 76 are covered by an insulating tubing 82, which extends to the end of the capacitor dielectric 68, and advantageously is electrically non-tracking and may have sheds thereon (as shown in dotted outline), especially for outdoor use. At the cable end, the tubular inner electrode 64 is plugged by an electrically conducting transition piece 84 for ease of connecting to the cable 62.

The cable 62 has an outer insulating jacket 86, a conducting earthing braid 88, a screen layer 90, primary insulation 92, and a conductor 94, these components being stripped for splicing the cable in standard manner.

The transition piece 84 of the inner electrode 64 of the capacitor 60 is joined to the cable conductor 94 by a crimp 96. Stress controlling mastic material 98 is used to fill in the region around the crimp 96 and between the end of the capacitor dielectric 68 and the cable primary insulation 92. A recoverable stress control tubing 100 is recovered to extend from the capacitor guard ring 72 proximate to the cable 62, over the end of the capacitor dielectric 68, across the mastic 98, over the end of the cable primary insulation 92 and on to the earthed cable screen 90. A co-extruded tubing 102, having an insulating inner component and a conducting outer component, is recovered over the stress control tubing 100, and a braid layer 104, for carrying earth fault current, is arranged on top of this. Both the outer conducting component of the tubing 102 and the braid 104 are electrically connected to the guard ring electrode 72 at the end of the capacitor 60 proximate to the cable 62, for enhancing the protection of the capacitor, as well as both being connected to the earthed cable braid 88. Finally, an outer layer 106 of insulating, and advantageously non-tracking, material is recovered over the braid and so as to extend at one end on to the cable outer jacket 86 and at the other end on to the capacitor insulating tubing 78 proximate to the cable 62. The electrical connection between the capacitor 60 and the cable 62 is completed by leads 108 and 110 that extend to earth from the capacitor guard rings 72 respectively remote from and proximate to the cable 62. A metal lug 112 plugs into the inner capacitor electrode 64 at the end remote from the cable.

The outer, low voltage, electrode lead 80 is connected into a capacitive voltage dividing and measuring circuit as described with reference to FIG. 3, for measurement of the voltage of the inner electrode 64, and thus of the cable conductor 94. The capacitor 60 may be provided with a conductive, earthed metal housing for further environmental and electrical protection, and one or more current transformers, as described with reference to FIG. 2 may be associated with the capacitor, advantageously being located in the housing, when provided.

The apparatus of FIG. 5 provides a single and convenient way of measuring the voltage, and current if required, of a power cable, with the minimum of disturbance thereto. The cable end is prepared as if it were to be conventionally spliced or terminated, and, in effect, the capacitor is interposed between the cable and its terminating lug and is spliced to the cable in a manner as if it were itself another cable. The cable with the measuring apparatus attached thereto can then be conventionally mounted, by means of the lug, on to electrical equipment such as switchgear or a voltage transformer.

Figure 6:
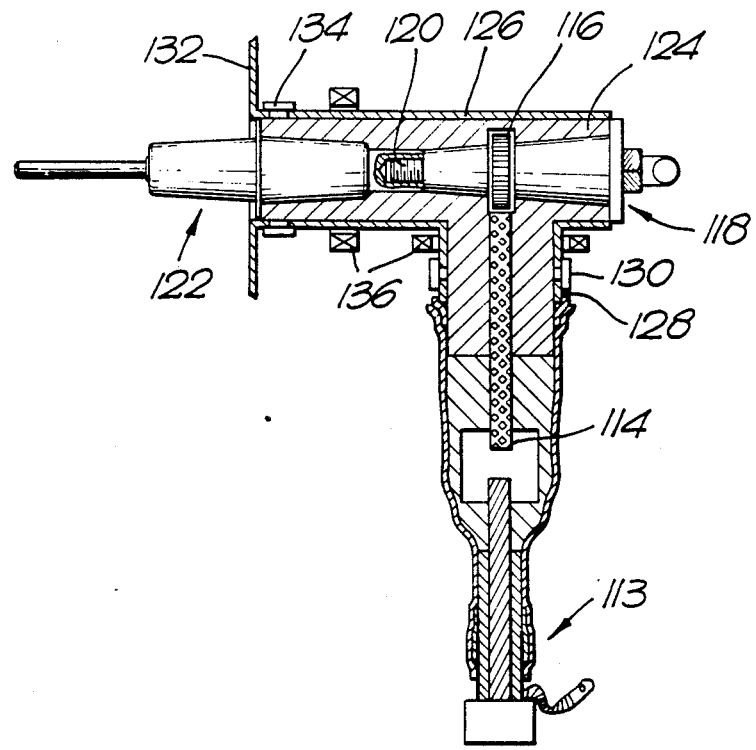
FIG. 6 shows a simplified form of the apparatus of FIG. 2 spliced to an electric power cable to form an elbow termination therefor.

FIG. 6 shows a modification of the apparatus of FIG. 5, in that a cable 113 instead of being connected through a voltage measuring capacitor to a terminating lug, is connected through an L-shaped adaptor, or elbow, which acts as a capacitor, for push fitting on to a bushing of equipment such as switchgear or a transformer. Since the cable 113 is identical to the cable 62 of FIG. 5, and since the connections of the cable conductor, insulation and screen to the corresponding components of the capacitor at the capacitor end proximate to the cable are identical to those described with reference to FIG. 5, these will not be described here in detail.

The capacitor of the apparatus of FIG. 6 has an inner electrode 114 that for part of its length is rod-shaped, and that is connected by means of an annular contact 116 to an interchangeable plug 118 for connection through a pin 120 with the conductor of a bushing 122 and thus to electrical equipment associated therewith. The rod-shaped portion of the electrode 114 is embedded in electrical insulation material 124 that provides the dielectric of the capacitor and that forms the L-shaped body of the adaptor. The insulation 124 has two sockets that are arranged to receive respectively the plug 118 and the bushing 122 as push fits in axial alignment substantially perpendicularly to the rod shaped electrode portion. The outer surface of the insulating body 124 has a conductive layer 126 thereon, that serves as the outer, low voltage electrode of the capacitor. On the stem portion of the adaptor, proximate to the cable 113, the outer electrode 126 is spaced from a cylindrical guard ring electrode 128, also disposed on the insulation 124, by stress control tubing 130. The bushing 122 is mounted on a conducting, and earthed, flange 132, that acts as a guard ring at this end of the adaptor, and the flange 132 is separated from the conductive outer surface 126 of the adaptor by stress control tubing 134. A lead (not shown) from the outer electrode 126 to a voltage dividing and measuring circuit can thus be arranged to provide the value of the voltage of the cable conductor.

Furthermore, a current transformer 136 may be mounted around either the stem or the transverse portion of the adaptor, so that the current flowing through the conductor may also be measured.

The plug 118, as shown, is arranged to interconnect the rod electrode of the capacitor electrically with the conductor of the bushing, but the plug 118 is interchangeable, and may be replaced by a plug that electrically isolates these two conductive members, so that tests may be carried out on the electrical equipment or on the cable. Such plugs are described and claimed in co-pending British Patent Application No. 8431393.

Figure 7:
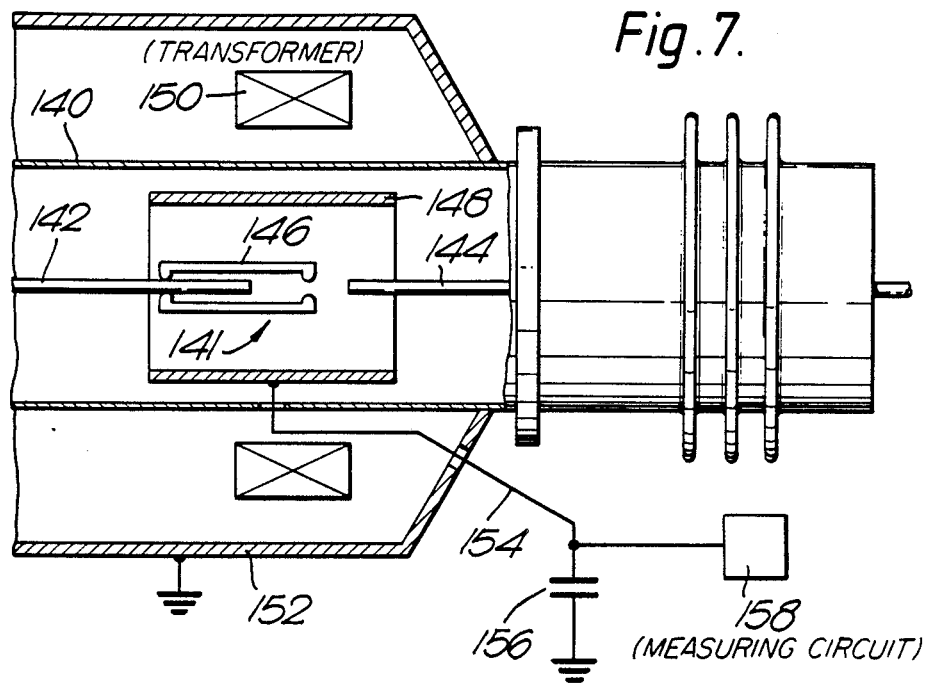
FIG. 7 shows a simplified form of the apparatus of FIG. 2 in combination with a switch.

FIG. 7 shows the combination of a voltage measuring capacitor with a switch, whereby the condition of the switch may be conveniently determined from measurement of the capacitance.

The switch has an outer metal shielded and earthed cylindrical casing 140. The casing 140 contains a contact assembly 141 comprising two fixed electrical contact elements 142 and 144, and a movable contact element 146 that has a plurality of resilient fingers. As shown, the switch is in its open condition, that is to say with the contact elements 144 and 146 disengaged. One or the other of the fixed contact elements may, however, be energised. On operation of the switch (by means not shown), the movable contact element 146 is moved along its axis such that its fingers engage also with the fixed contact element 144, thus bringing the switch to its closed condition.

A cylindrical metal electrode 148 is disposed within the casing 140, spaced apart from the casing and from the switch contact elements, the electrode 148 being of such a length as to enclose the contact assembly 141 in the closed condition and in the open condition of the switch. The contact elements 142, 144 and 146 form the inner electrode of a capacitor whose outer electrode is provided by the member 148. The dielectric is the insulating medium of the switch, which may be vacuum, or an insulating gas, such as sulphur hexafluoride ($SF_6$) at elevated pressure. The capacitance of the capacitor will vary in dependence on whether the switch is open or closed, and whether one, or the other, or both contact elements are energised. The capacitor can be calibrated to provide these indications. It will be appreciated that as shown diagrammatically in FIG. 7, the outer electrode 148 of the capacitor will be connected to a measuring circuit of the kind shown in FIG. 3, whereby an insulated lead 154 extends from the electrode 148, out through the casing 140 and via a low voltage capacitor 156 to earth. A measuring circuit 158 shown schematically is arranged selectively to provide the indication of the switch condition and the voltage of the contact elements.

If current measurement is required, then a current transformer 150 may be disposed around the casing 140 co-axially with the outer electrode 148, and advantageously is itself enclosed within an earthed metal casing 152.

It will be appreciated that the switch will be electrically connected in series with other electrical equipment, such as an electrical power cable or a voltage transformer.

Figure 8:
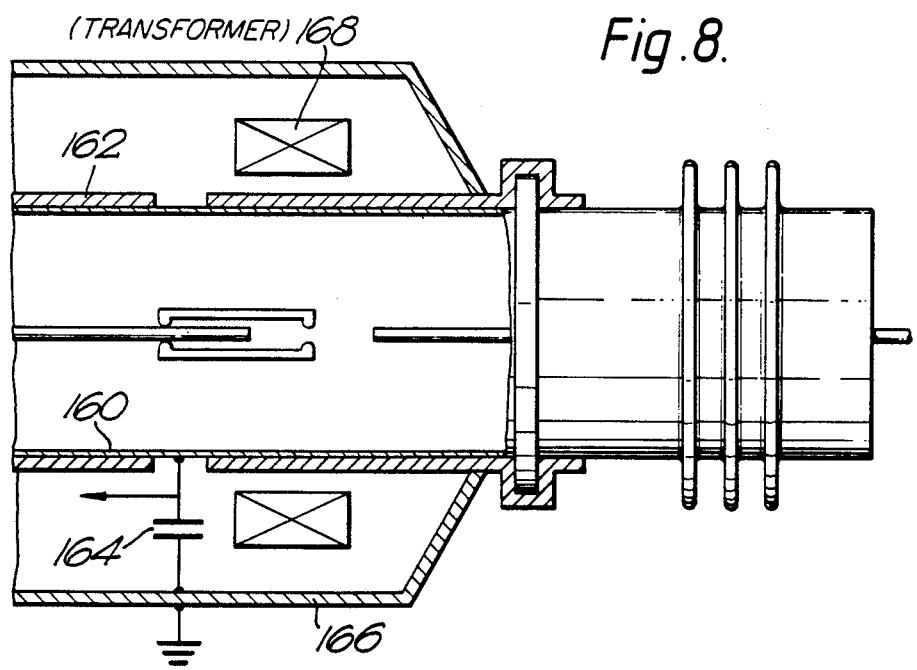
FIG. 8 shows a modified form of the apparatus of FIG. 7.

FIG. 8 shows a modification of the switch of FIG. 7, in which the outer metal casing 160 itself provides the outer electrode of the high voltage capacitor. Consequently, to ensure accuracy of the measurement and safety in operation, the casing 160 has an outer insulation covering 162 so that the casing 160 is allowed electrically to float to a potential of about 50 V. As with the switch of FIG. 7, a further, fixed capacitor 164 of known capacitance is connected to the casing 160 and to earth potential, which may conveniently be an outermost earthed metal casing 166 that encloses a current transformer 168.

We claim:

1. High voltage apparatus comprising a capacitor of generally cylindrical configuration, the capacitor comprising; an elongate, inner electrode; solid resilient, electrical insulation material mounted on the inner electrode to provide the dielectric of the capacitor; an outer cylindrical electrode substantially coaxial with the inner electrode and mounted on a portion only of the outer surface of the insulation material, the inner and outer electrodes and the insulation material being arranged to provide the generally cylindrical capacitor with a known capacitance; at least one substantially cylindrical guard ring electrode mounted on the outer surface of the insulation material so as to be spaced apart by a gap from an end of the outer electrode; and stress control means comprising a material having a specific impedance of between about $10^6$ ohm-cm and $10^{10}$ ohm-cm and extending across said gap arranged to overlap and make electrical contact with the outer electrode and the or each of said guard ring electrodes, thereby to control the electrical stress between said electrodes.

2. Apparatus according to claim 1, comprising further stress control means that extends from the insulation material over the exposed edges of the electrodes, thereby to control the electrical stress at said electrode edges.

3. Apparatus according to claim 1, comprising a housing that forms a protective enclosure around at least the length of the outer electrode of the capacitor.

4. Apparatus according to claim 3, wherein the housing is electrically conductive and is electrically connected to at least one guard ring electrode so as to be at substantially the same potential.

5. Apparatus according to claim 1, having an electrically insulating and substantially non-tracking outer surface that extends over the exposed outer surface of the insulation material.

6. Apparatus according to claim 1 wherein at least one of said insulation material, electrodes, and stress control means comprises heat-recoverable tubing.

7. Apparatus according to claim 1, comprising an electrical circuit component of known impedance electrically connected in series with the capacitor so as to form a voltage dividing circuit.

8. Apparatus according to claim 7, comprising a voltage measuring circuit connected to said capacitor and said component to determine the electrical potential of the inner electrode of said high voltage capacitor.

9. Apparatus according to claim 1, comprising at least one current transformer mounted around the capacitor substantially coaxially with the inner electrode thereof.

10. Apparatus according to claim 9, wherein the at least one current transformer is arranged to measure at least one of the current flowing through the inner electrode under normal operating conditions, and the current flowing through the inner electrode under fault conditions.

11. Apparatus according to claim 1, wherein at one end the capacitor is electrically connected to an electric power cable, with the inner electrode of the capacitor being connected to the conductor of the cable.

12. Apparatus according to claim 11, wherein the capacitor is connected to the conductor at the end of the cable.

* * * * *